(12) United States Patent
Perumana et al.

(10) Patent No.: US 10,419,043 B2
(45) Date of Patent: *Sep. 17, 2019

(54) MULTI-CHIP MILLIMETER-WAVE INTERFACE

(71) Applicant: Avago Technologies International Sales PTE. Limited, Singapore (SG)

(72) Inventors: Bevin George Perumana, Riverside, CA (US); Saikat Sarkar, Irvine, CA (US); Tirdad Sowlati, Irvine, CA (US)

(73) Assignee: Avago Technologies International Sales PTE. Limited, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/275,185

(22) Filed: Feb. 13, 2019

(65) Prior Publication Data
US 2019/0181894 A1 Jun. 13, 2019

Related U.S. Application Data

(63) Continuation of application No. 15/199,692, filed on Jun. 30, 2016, now Pat. No. 10,263,652.

(60) Provisional application No. 62/341,027, filed on May 24, 2016.

(51) Int. Cl.
| | |
|---|---|
| *H04B 1/04* | (2006.01) |
| *H04B 7/06* | (2006.01) |
| *H01L 23/66* | (2006.01) |

(52) U.S. Cl.
CPC ........... *H04B 1/0458* (2013.01); *H01L 23/66* (2013.01); *H04B 7/0617* (2013.01); *H04B 7/0689* (2013.01); *H01L 2223/6677* (2013.01); *H01L 2223/6683* (2013.01)

(58) Field of Classification Search
CPC ..... H04B 1/0458; H04B 7/0613; H01L 23/66; H01L 2223/6677; H01L 2223/6683
USPC .................................................. 375/295, 299
See application file for complete search history.

(56) References Cited

U.S. PATENT DOCUMENTS

| | | | |
|---|---|---|---|
| 2009/0006077 A1* | 1/2009 | Keaveney | G01C 21/36 704/9 |
| 2016/0248451 A1* | 8/2016 | Weissman | H04B 1/0064 |

* cited by examiner

*Primary Examiner* — Chieh M Fan
*Assistant Examiner* — Fitwi Y Hailegiorgis
(74) *Attorney, Agent, or Firm* — Morgan, Lewis & Bockius LLP

(57) ABSTRACT

Systems and methods are provided for millimeter-wave (MMW) communication, the system includes a transceiver chip to generate and to receive signals. An interface is used to communicate the signals between the transceiver chip and one or more active antenna modules. The signals include modulated MMW signals and control signals. The transceiver chip includes baseband circuitry, up and down conversion mixers, and RF front-end circuitry. An active antenna module receives a first modulated MMW signal from the interface for transmission via antennas and to receive a second modulated MMW signal from the antennas for transmission through the interface to the transceiver chip.

20 Claims, 8 Drawing Sheets

MULTI-CHIP MILLIMETER-WAVE INTERFACE

CROSS-REFERENCE TO RELATED APPLICATIONS

This application is a continuation of the U.S. patent application Ser. No. 15/199,692 filed Jun. 30, 2016, which claims the benefit of priority under 35 U.S.C. § 119 from U.S. Provisional Patent Application 62/341,027 filed May 24, 2016, which are incorporated herein by reference in their entirety.

TECHNICAL FIELD

The present description relates generally to integrated circuits, and more particularly, to multi-chip millimeter-wave interfaces.

BACKGROUND

Millimeter-wave (MMW) electromagnetic radiation corresponds to the extremely-high frequency (EHF), which is designated for the 30 to 300 GHz band of the radio-frequency (RF) spectrum. The radio waves in this band suffer high atmospheric attenuation due to absorption by the atmospheric gasses, and their application is limited to terrestrial communication in the kilometer range.

Due to high losses of millimeter-wave signals in interconnects, millimeter-wave front-end blocks have to be placed in close proximity to the millimeter-wave antennas to limit impact on transmitter output power and receiver noise figure. Existing solutions transmit modulated signals at intermediate frequency (IF) that could potentially have severe bandwidth limitation due to large fractional bandwidth, especially for high throughput applications using channel bonding. The existing technology does not allow the use of direct conversion radio architecture, which leads to larger die area and requires noise-sensitive local oscillator (LO) signal generation and/or multiplication in a front-end chip. This can complicate implementation of both the chip and the interface architecture.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

In one or more aspects of the subject technology, systems and configurations are described for providing a multi-chip millimeter-wave interface for sending and receiving modulated signals at the same carrier frequency as the actual millimeter-wave (MMW) link. The subject technology enables placing different chips at optimal locations in a platform with minimal die area penalty, while supporting higher bandwidth to enable channel bonding and other systemologies to increase overall throughput. The subject solution is scalable to a multi-chip hierarchical phased-array system in which each millimeter-wave port in the front-end can be connected to either an antenna, or another phased array active antenna module. Multiple active antenna modules could be connected to either enable diversity switching and/or combined beamforming. The MMW interface of the subject technology removes any requirement of LO generation and/or multiplication in the front-end ICs. This relaxes noise requirement on the interface and enables simplified transmission of control link and DC power across the interface. The subject technology supports various radio architectures including homodyne radio architecture, and allows channel boding for increasing throughput while maintaining all the above-mentioned flexibilities.

Figure 1A:
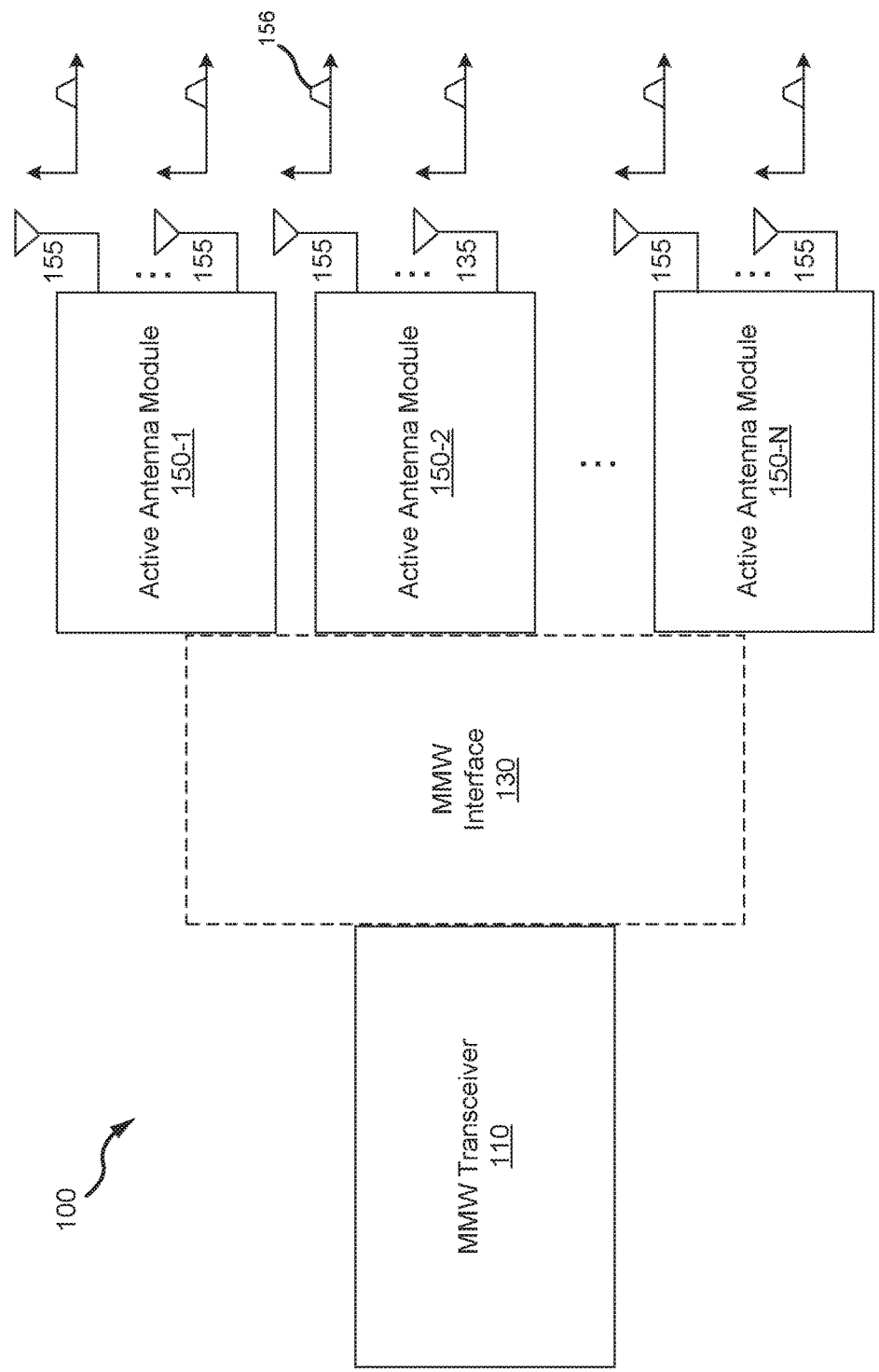
FIGS. 1A through 1D illustrate an example of a multi-chip millimeter-wave (MMW) transceiver system according to aspects of the subject technology.

FIGS. 1A through 1D illustrate an example of a multi-chip MMW transceiver system 100 according to aspects of the subject technology. In some implementations, the MMW transceiver system 100, as shown in FIG. 1A, includes a MMW transceiver chip 110, a MMW interface connecting the MMW transceiver chip 110 to a number of (e.g., N, such as 16 or more) active antenna modules 150 (e.g., 150-1, 150-2 ... 150-N). Each of the active antenna modules 150 is connected to one or more MMW antennas that are capable of transmitting and/or receiving MMW signals 156. The MMW transceiver chip 110 can generate and receive signals (e.g., MMW and other signals) from the active antenna modules 150 through the MMW interface 130. In some aspects, the MMW interface 130 communicates the signals between the transceiver chip 110 and the active antenna modules 150 without conversion of MMW signals to intermediate frequency (IF) signals. The communicated signals include modulated MMW signals and control signals. In some implementations, the communicated signals also include clock signals, as described in more details herein.

The MMW transceiver system 100 supports both combined beamforming and diversity switching modes of operation. In some aspects, some of the active antenna modules 150 may be combined in a combined beamforming mode to achieve a higher level of beamforming. In one or more aspects, some of the active antenna modules 150 may be used in a in a diversity switching mode. In diversity switching mode, one or more of the active antenna modules 150 are active to cover a specific direction, while the rest are not active.

The multi-chip MMW transceiver system 100 meets requirements for channel bonding for increasing throughput. The multi-chip MMW transceiver system 100 saves on overall die area requirement, is less complex, and has a smaller noise impact because there is no LO frequency generation, multiplication and/or translation in the active antenna modules 150. This also greatly simplifies control link and DC power transmission across chips, as there is no noise sensitive frequency generation/multiplication/translation in the active antenna modules 150. The control link can be further simplified as the low frequency noise requirements are relaxed significantly.

Figure 1B:
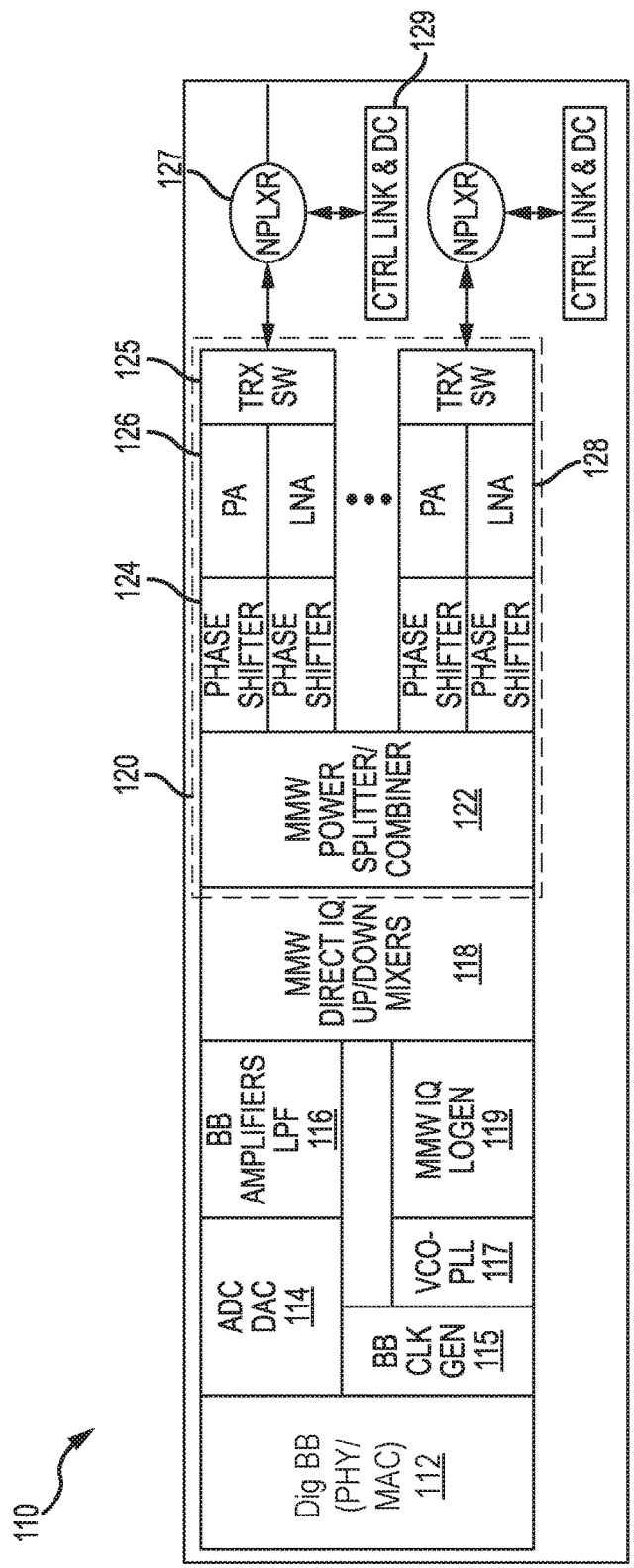

In one or more aspects, the transceiver chip 110, as shown in FIG. 1B, includes baseband circuitry including digital baseband 112, analog-to-digital converter (ADC) and digital-to-analog converter (DAC) circuits 114, baseband clock generator 115, and baseband amplifiers 116. The transceiver chip 110 further includes MMW up and down conversion mixers 118, and RF front-end circuitry 120. A voltage-controlled oscillator (VCO) phase-locked loop (PLL) 117 and a MMW in-phase and quadrature-phase (IQ) local oscillator generator (LOGEN) 119 support the MMW up and down conversion mixers 118. The digital baseband 112 includes logic circuitry, modules, and codes to support physical layer (PHY) and media control access (MAC) layers and other baseband functionalities. The baseband clock generator 115 generates clock signals. For example, for the ADC and DAC circuits 114 and the digital baseband 112. The VCO-PLL 117 can be used by the MMW IQ LOGEN 119 to generate LO signals (e.g., IQ LO signals). In some aspects, the VCO-PLL 117 is used to generate clock signals for the digital baseband.

The MMW up and down conversion mixers 118 are responsible for up-conversion of the baseband signals to modulated MMW signals with multi GHz frequencies (e.g., 60 GHz), and for down-conversion of the modulated MMW signals received from the RF front-end circuitry 120. MMW up and down conversion mixers 118 uses IQ LO signals generated by the MMW IQ LOGEN 119 to perform the up and down conversions. This is an advantageous feature of the subject technology that directly modulates baseband signals to generate MMW frequencies for transmission and, contrary to the existing solutions, does not transmit modulated signals at intermediate frequency (IF). It is understood that transmitting signal at IF frequencies could potentially have severe bandwidth limitation especially for high throughput applications using channel bonding, due to large fractional bandwidth. The subject technology allows the use of direct conversion radio architecture, which leads to substantial saving in die area and is not demanding on noise-sensitivity of LO signal generation and/or multiplication in the active antenna module.

In one or more aspects, RF front-end circuitry (e.g., an active antenna module) 120 includes a MMW power splitter and combiner 122 and multiple beamforming channels. The MMW power splitter and combiner 122 is capable of splitting and combining signal power. Hereinafter, the MMW power splitter and combiner 122 is called the MMW power splitter 122 or the MMW power combiner 122, based on the operational application. For example, when the MMW power splitter and combiner 122 is operating as a splitter, it is referred to as MMW power splitter 122. The MMW power splitter 122 receives the modulated MMW signal generated by the MMW up conversion mixer 118 and splits the modulated MMW signal between the beamforming channels (e.g., with equal powers). In some aspects, the powers of the modulated MMW signals received by the beamforming channels are different. The MMW power combiner 122 further is tasked with combining modulated MMW signals received from the beamforming channels to form a single modulated MMW signal for the MMW down conversion mixer 118.

The beamforming channels process the modulated MMW signals for transmission by multiple MMW antennas or for transmission to other chips as further described herein. Each beamforming channel includes a receive (RX) and a transmit (TX) beamforming channel. The TX beamforming channel includes a phase shift circuit 124 and a power amplifier (PA) circuit 126. The RX beamforming channel includes a low-noise amplifier (LNA) circuit 128 and a similar phase shift circuit 124. Each beamforming channel is connected to a transmit-receive (TRX) switch circuit 125. The TRX switch circuit 125 can connect one of the TX or RX beamforming channels to a multiplexer 127 (e.g., an N-plexer such as a duplexer or a four-plexer). For example, a TX MMW signal from the PA circuit 126 is routed to the multiplexer 127 and isolated from the LNA circuit 128, whereas a RX MMW signal from the multiplexer 127 is routed to the LNA circuit 128.

The multiplexer 127 selectively communicates the MMW signals between the MMW transceiver chip 110 and a subsequent circuit or chip (e.g., the active antenna module 150 of FIG. 1A) or provides one or more control signals or DC power supply to the subsequent circuit. The control link and DC circuit 129 provides control signals and DC bias for provision to the subsequent circuit or chip. In some aspects, the control link and DC circuit 129 further provides clock signals for use by the subsequent circuit or chip. This can be beneficial as the subsequent circuit or chip can use the control signals, clock signals, and/or DC supply already existing in the MMW transceiver chip 110 and hence does not require separate dedicated power supplies and control signaling at each active antenna module. In one or more aspects, the control link and DC circuit 129 uses clock signals generated by the VCO-PLL 117 or the baseband clock generator 115.

Figure 1D:
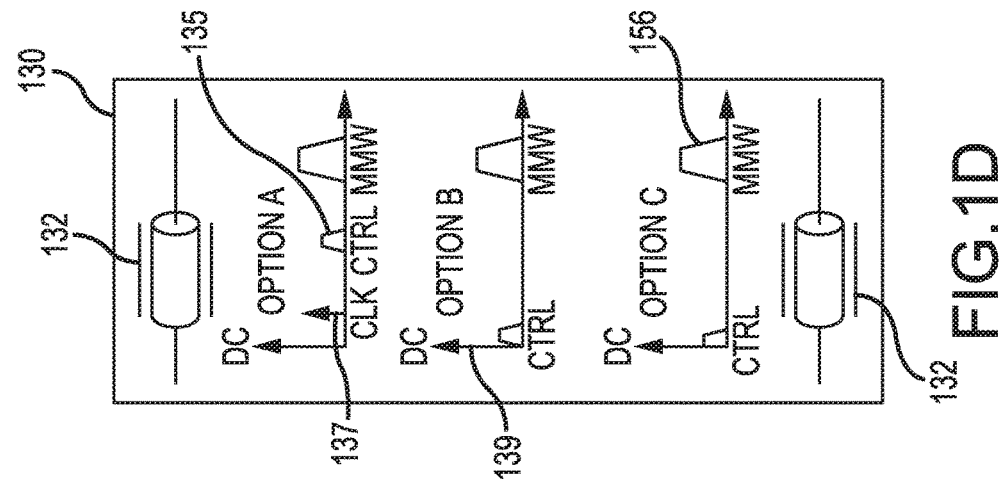
Figure 1C:
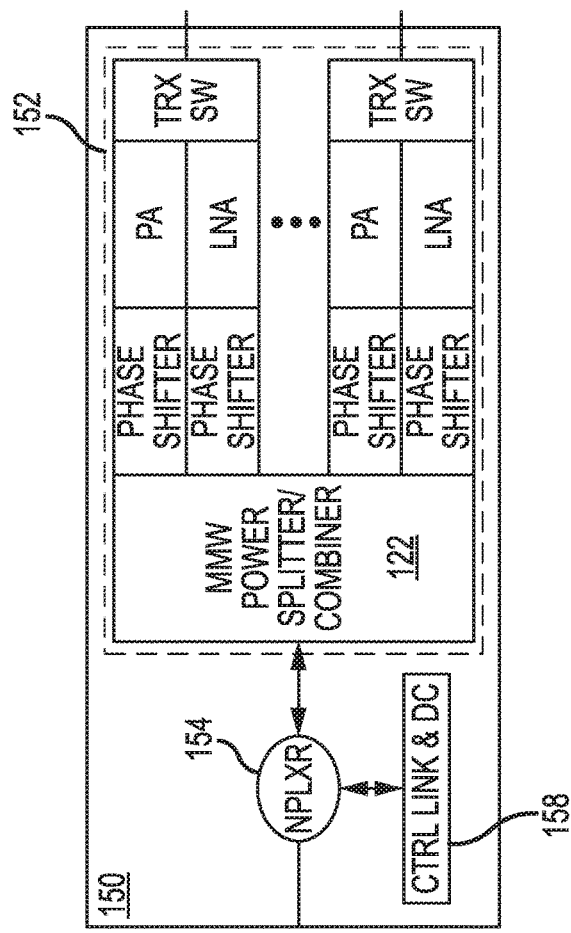

The active antenna module 150, as shown in FIG. 1C, can be implemented as a separate chip. The active antenna module 150 includes a multiplexer 154 (e.g., an N-plexer such as a duplexer or a four-plexer), a control link and DC circuit 158 and an RF front-end circuit 152. In some aspects, the multiplexer 154 and the control link and DC circuit 158 can be removed, disabled, or bypassed, in which case the RF front-end circuit 152 is directly coupled to the MMW transceiver chip 110 of FIG. 1B through the interface circuit 130. In one or more aspects, the RF front-end circuit 152 is similar to the RF front-end circuit 120 of FIG. 1B. In some implementations, the active antenna module 150 is similar to the MMW transceiver chip 110 of FIG. 1B, in which non-used circuitry (e.g., digital baseband 112, ADC and DAC circuits 114 baseband amplifiers 116, MMW direct IQ up and down mixers 118) are disabled, removed, or bypassed. In some aspects, the baseband clock generator 115 and VCO-PLL 117 are not disabled and used by the control link and DC circuit 158. The active antenna module 150 receives a first modulated MMW signal (e.g., a TX MMW signal) from the interface 130 of FIG. 1A for transmission via a number of antennas (e.g., 155 of FIG. 1A) and receives a second modulated MMW signal (e.g., an RX MMW signal) from the antennas for transmission via the interface 130 to the MMW transceiver chip 110.

In one or more implementations, the interface 130, as shown in FIG. 1D, is an MMW interface and includes a coaxial cable 132, a printed circuit board (PCB), or a flexible PCB. In some aspects, the PCB is the same PCB, on which the MMW transceiver chip 110 and the active antenna modules 150 are mounted. An important feature of the subject technology is the simplified signaling between the MMW transceiver chip 110 and the active antenna modules 150 via the interface 130. The signals include a modulated MMW signal 156, a control signal 135, an optional clock signal 137, and a DC supply 139, shown in FIG. 1D, on a frequency spectrum. In some implementations, the control signal 135 is a modulated control signal (e.g., at 3 GHz). The low frequency noise requirements in the disclosed methodology is relaxed as there is no LO frequency generation/multiplication or other frequency translation requirements in the active antenna module. This allows a frequency of the control channel of the transceiver chip to be located close to zero frequency (DC) (e.g., Option B in FIG. 1D) or even at DC (e.g., Option C in FIG. 1D). The control signal 135 may be used for handshaking or other purposes, for example, controlling the phase shifts between two active antenna module 150 or for controlling gains of variable gain blocks in active antenna module. In some aspects, the active antenna module 150 may use the control signal 135 to generate clock signals. The signaling of the subject solution does not involve frequency generation, translation, or multiplication (e.g., of an LO signal) in the active antenna module. This makes the disclosed solution significantly simpler and more efficient compared to the existing solutions that have to use some frequency generation, translation, or multiplication, for example, to provide LO signals for up and down conversion in the active antenna module. Since the interface 130 does not have to communicate any LO signals, the low noise requirement of the interface is substantially relaxed. The disclosed architecture is fully scalable from single chip solution to two chip solution with a separate active antenna module to a multichip tiled solution, in which slave active antenna modules are connected to one or more masters for combined beamforming or for diversity switching, as illustrated herein.

Figure 2A:
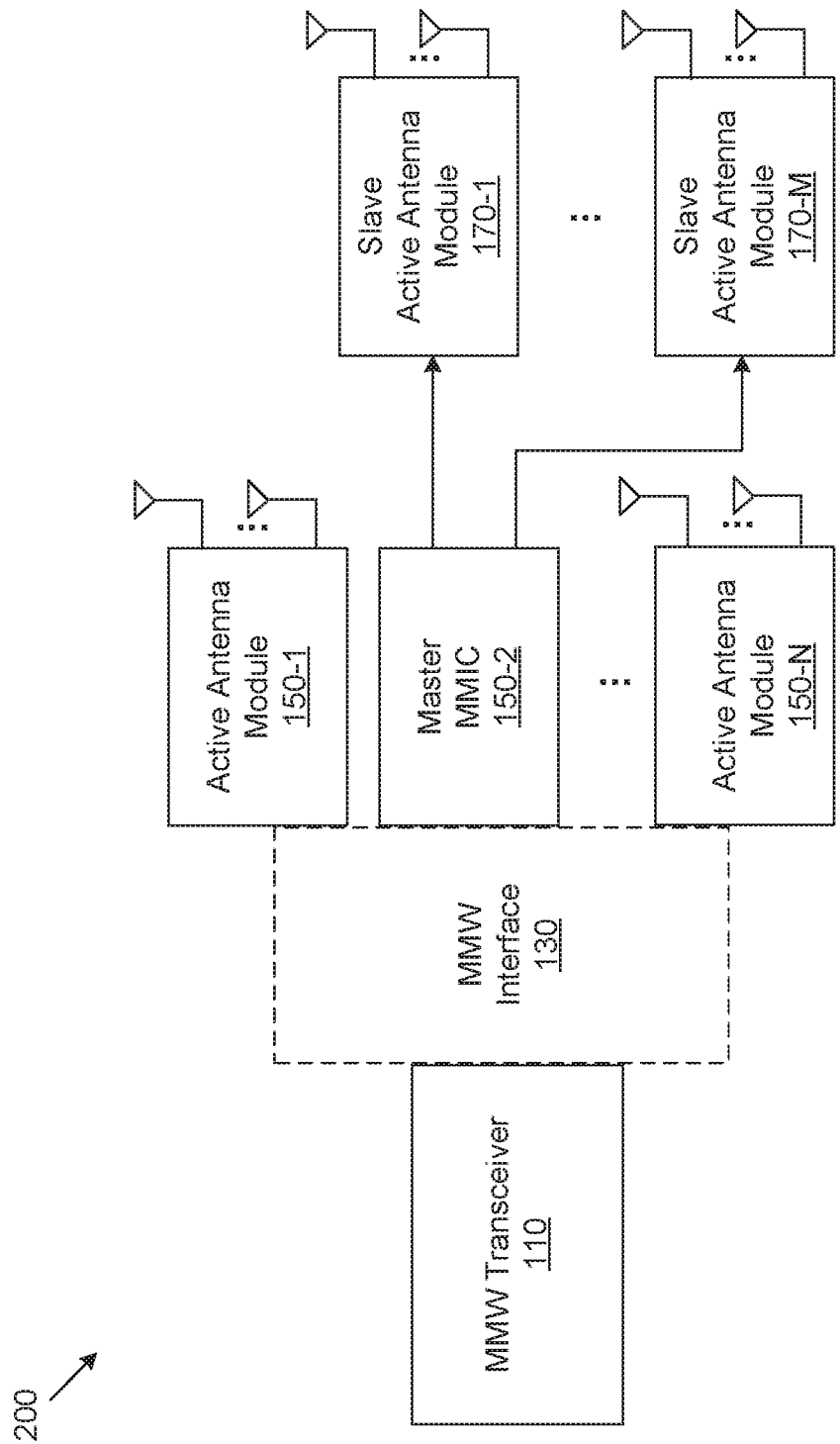
FIGS. 2A-2B illustrate an example of a multi-chip master-slave MMW transceiver system according to aspects of the subject technology.
Figure 2B:
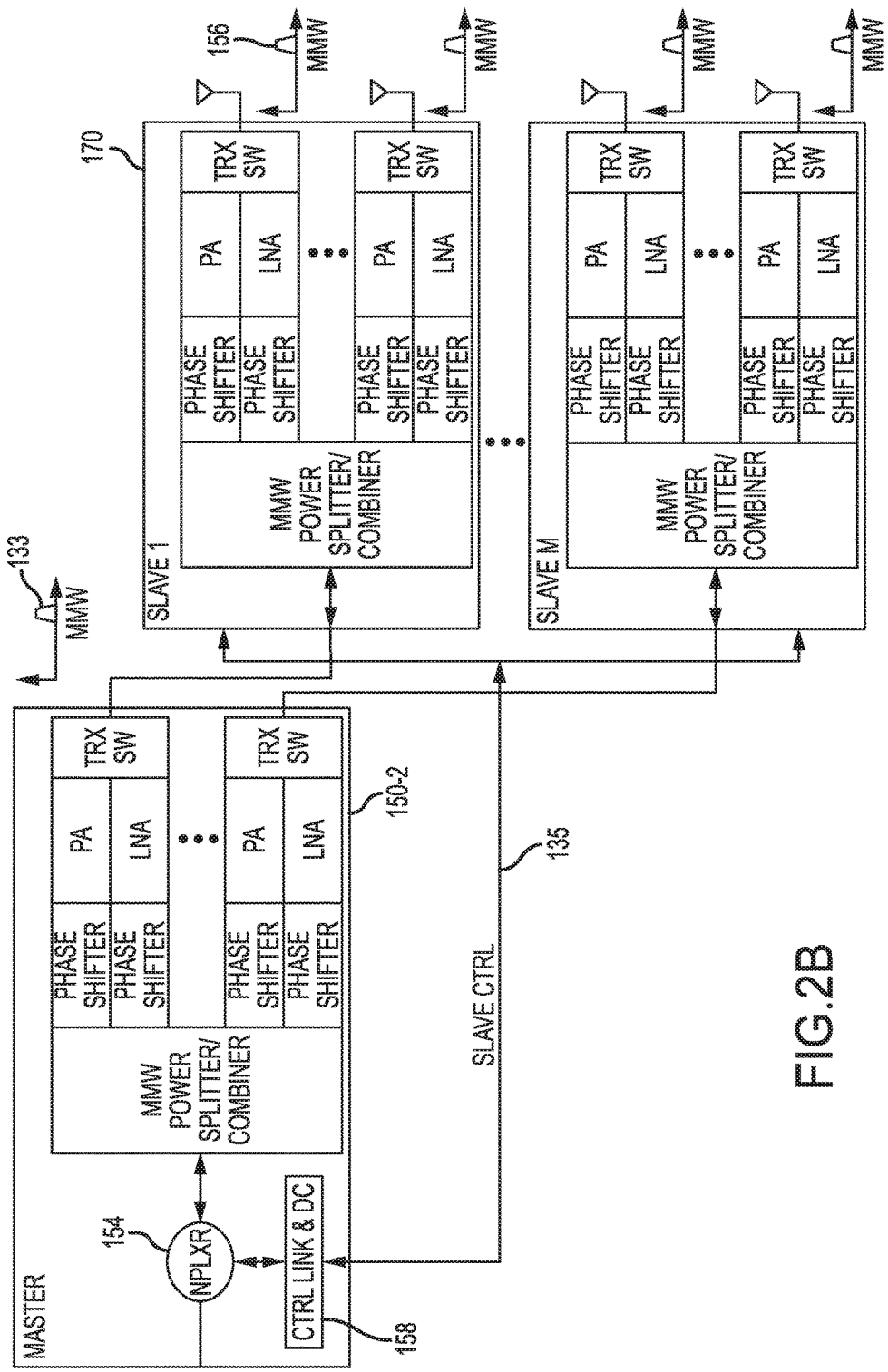

FIGS. 2A-2B illustrate an example of a multi-chip master-slave MMW transceiver system 200 according to aspects of the subject technology. The multi-chip master-slave MMW transceiver system 200 is similar to the multi-chip MMW transceiver system 100 of FIG. 1A, except that one or more of the active antenna modules 150, for example, 150-2 can be a master millimeter-wave integrated circuit (MMIC) that can connect to multiple slave active antenna modules. The master MMIC (e.g., 150-2) can be connected to one or more slave active antenna modules 170 (e.g., 170-1 . . . 170-M), each of which is coupled to one or more MMW antennas.

As shown in FIG. 2B, the master MMIC 150-2 is similar to the active antenna module 150 of FIG. 1C described above. The slave active antenna module 170 is similar to the master MMIC 150-2 except that respective DC supply and control circuit 158 and multiplexer 154 are removed, disabled, or bypassed. Each of the slave active antenna module 170 is coupled to a number of MMW antennas that are capable of communicating modulated MMW signals 156. The master MMIC 150-2 can provide control signals 135 for use by the slave active antenna module 170. In some aspects, the master active antenna module 150-2 can provide clock signals for use by the slave active antenna module 170. In some aspects, one or more of the of the slave active antenna module 170 includes the DC supply and control circuit 158 and multiplexer 154, but can be removed, bypassed or disabled in this mode of operation, and the slave active antenna module 170 can use a different bidirectional control scheme with the master MMIC 150-2, if required as shown in FIG. 2B.

Figure 3:
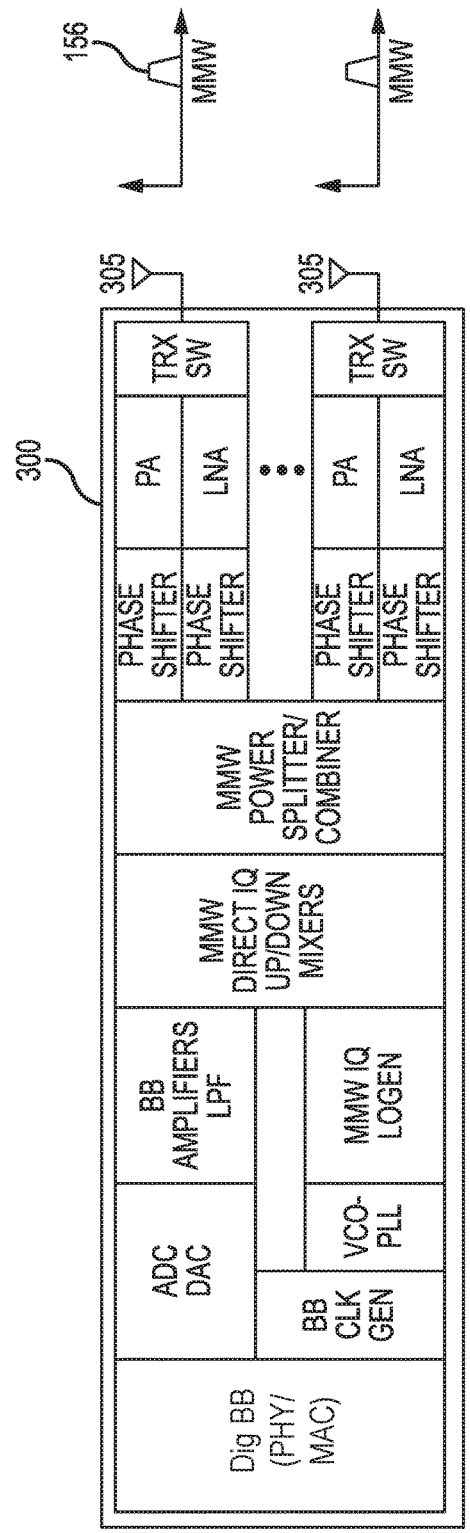
FIG. 3 illustrates an example of a single-chip MMW transceiver according to aspects of the subject technology.

FIG. 3 illustrates an example of a single-chip MMW transceiver 300 according to aspects of the subject technology. The single-chip MMW transceiver 300 is similar to the MMW transceiver chip 110 of FIG. 1B described above, except that the multiplexer 127 and the control link and DC circuit 129 are removed, disabled, or bypassed. The single-chip MMW transceiver 300 can be directly coupled to multiple MMW antennas and transmit and/or receive modulated MMW signals 156. The single-chip MMW transceiver 300 meets requirements for channel bonding for increasing throughput. The single-chip MMW transceiver 300 saves on overall die area requirement and is less complex and has a smaller noise impact since the chip does not use frequency generation, multiplication and/or translation. For example, the single-chip MMW transceiver 300 can be realized on a die with size of about 6 mm$^2$. The control link can be greatly simplified as the low frequency noise requirements are relaxed significantly. The disclosed interface is thus extremely scalable enabling the same MMIC 1540-2 to be configured to be used from the single chip use case (e.g., FIG. 3) to multiple hierarchical tiled modes such as a two-level mode, as shown in FIGS. 1A and 1B and a three-level mode, as shown in FIGS. 2A and 2B.

Figure 4:
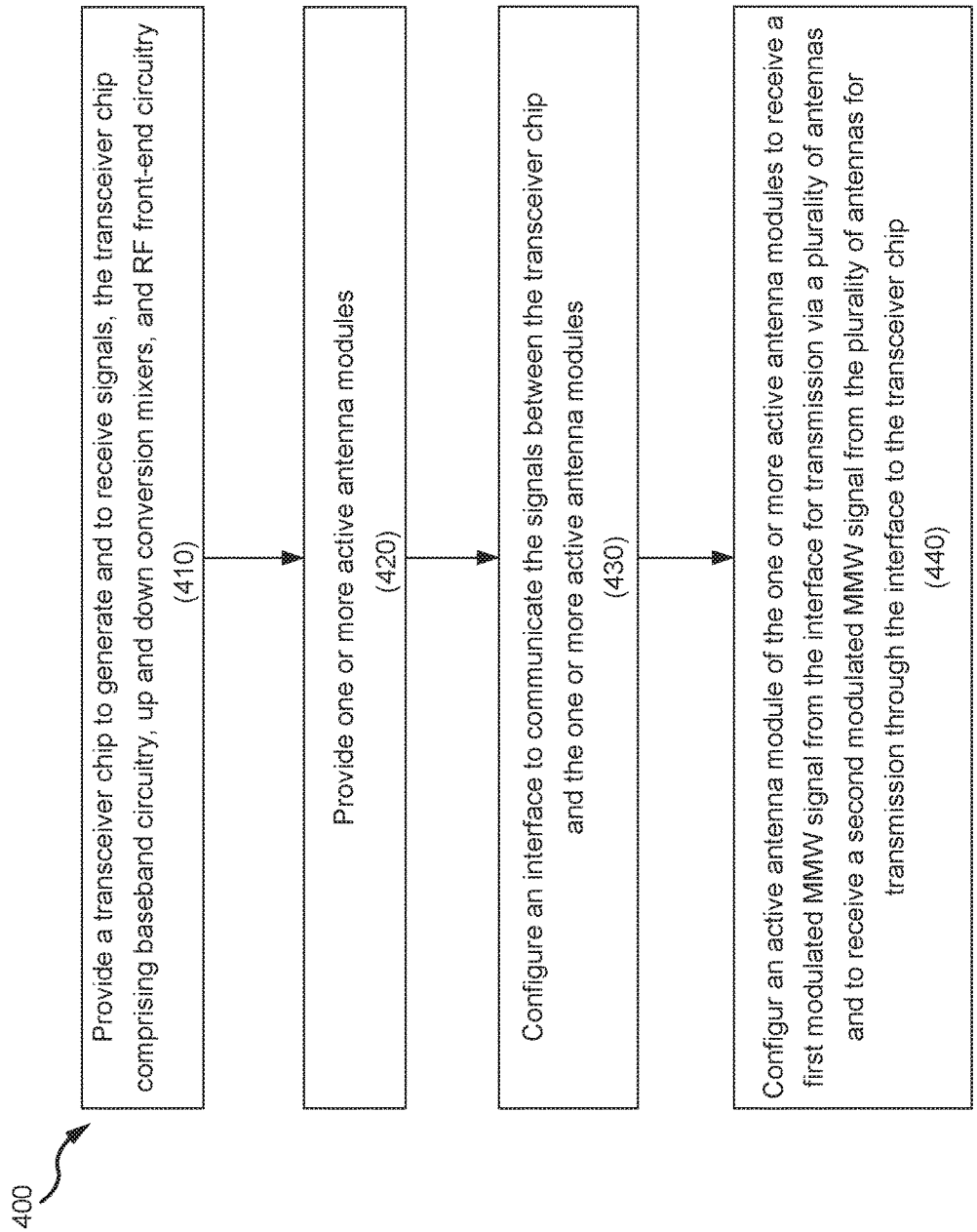
FIG. 4 is a flow diagram illustrating an example of a method for providing a MMW transceiver according to aspects of the subject technology.

FIG. 4 is a flow diagram illustrating an example of a method 400 for providing a MMW transceiver according to aspects of the subject technology. The method 400 includes providing a transceiver chip (e.g., 110 of FIGS. 1A and 1B) to generate and to receive signals, the transceiver chip comprising baseband circuitry (e.g., 112, 114, 115, and 116 of FIG. 1B), up and down conversion mixers (e.g., 118 of FIG. 1B), and RF front-end circuitry (e.g., 120 of FIG. 1B) (410). One or more active antenna modules (e.g., 150 of FIG. 1B) are provided (420). An interface (e.g., 130 of FIGS. 1A and 1D) communicates the signals between the transceiver chip and the one or more active antenna modules (430). An active antenna module of the one or more active antenna modules receives a first modulated MMW signal from the interface for transmission via a number of antennas (e.g., 155 of FIG. 1A) and receives a second modulated MMW signal (e.g., 156 of FIG. 1A) from the plurality of antennas for transmission through the interface to the transceiver chip (440). The signals include modulated MMW signals and control signals (e.g., 135 of FIG. 1D).

Figure 5:
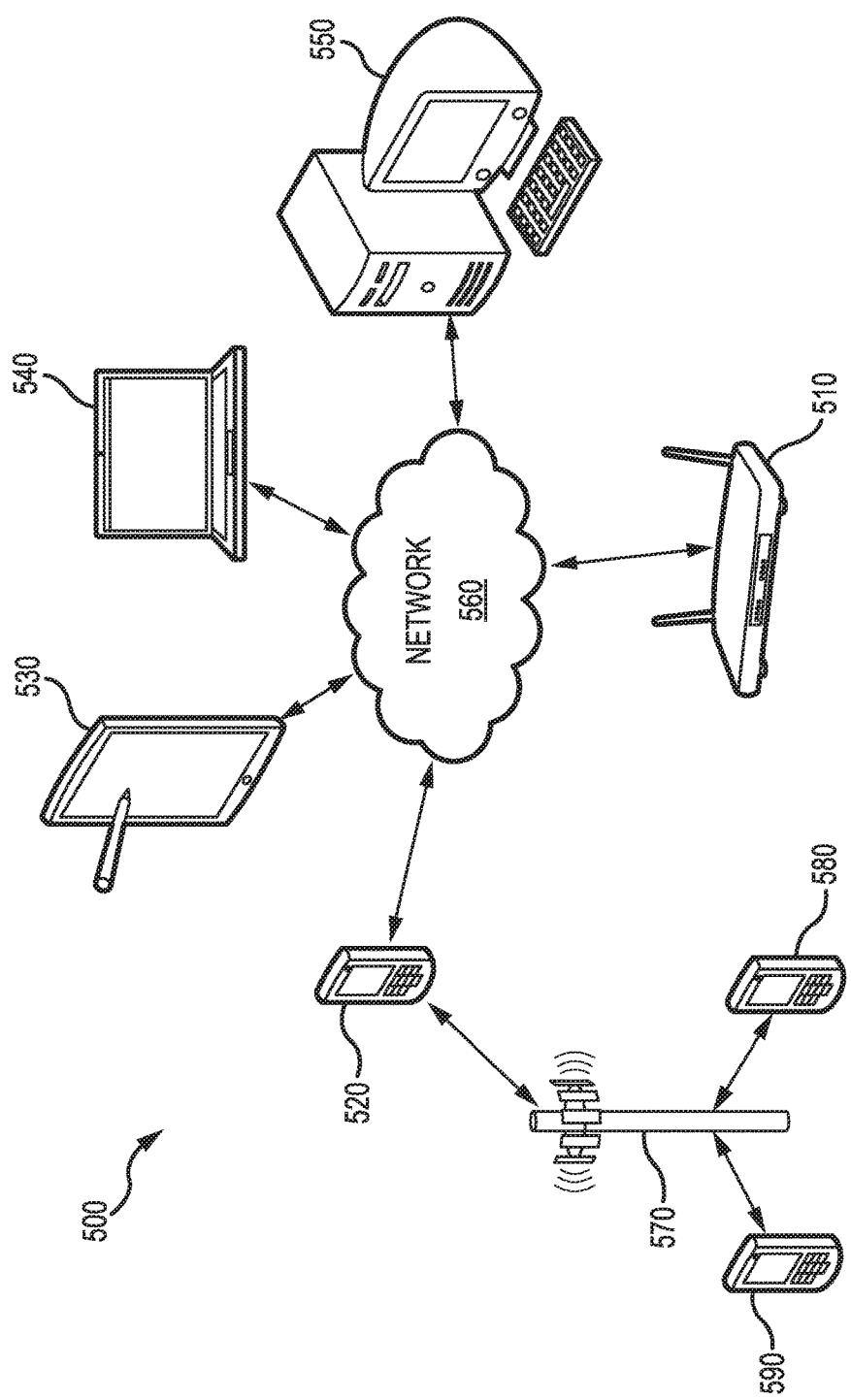
FIG. 5 is a block diagram illustrating an example of an environment, in which a MMW transceiver of the subject technology is used.

FIG. 5 is a block diagram illustrating an example of a network environment 500 that a MMW transceiver chip of the subject technology is used. The network environment 500 includes a number of devices including an access point 510, a mobile phone 520, a tablet 530, a laptop 540, and a desk top computer 510 communicating via a network 560. Examples of the network 560 includes the Internet, a wireless local area network (WLAN), a wide area network (WAN), a virtual private network (VPN), a home area network, or other networks. The mobile phone 520 may be in communication with a number of other mobile devices such as mobile phones 580 and 590 through a cellular network supported by a base station 570. In some aspects, any of the devices of the network environment 500 and/or the base station 570 may include a multi-chip MMW transceiver (e.g., 100 of FIG. 1A) or a single-chip MMW transceiver (e.g., 300 of FIG. 3) of the subject technology. The use of disclosed multi-chip MMW transceiver or the single-chip MMW transceiver in, for example, the base station 570, allows the base station 570 to benefit from a number of advantageous features of the subject technology. For example, the subject technology enables placing different chips at optimal locations in a platform with minimal die area penalty, while supporting higher bandwidth to enable channel bonding and other systemologies to increase overall throughput. The MMW interface of the subject technology removes any requirement of LO generation and/or multiplication in the front-end ICs. This relaxes noise requirement on the interface and enables simplified transmission of control link and DC power across the interface.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A millimeter-wave (MMW) transceiver system, the system comprising:
   a transceiver chip configured to generate and to receive and/or transmit signals; and
   an interface configured to communicate the signals including modulated MMW signals, a control signal and a DC supply voltage between the transceiver chip and one or more active antenna modules to avoid local oscillator (LO) generation,
   wherein:
   the transceiver chip comprises baseband circuitry, up and down conversion mixers, and RF front-end circuitry, and
   an active antenna module of the one or more active antenna modules comprises a master millimeter-wave integrated circuit (MIMIC) followed by a plurality of slave active antenna modules directly in parallel with each other, the MIMIC is configured to provide control signals for at least some of the plurality of slave active antenna modules, and wherein the interface is scalable and allows the master MMIC to be used in multiple hierarchical tiled modes.

2. The system of claim 1, wherein the interface comprises an MMW interface including a coaxial cable, a printed circuit board (PCB), or a flexible PCB.

3. The system of claim 1, wherein the transceiver chip further comprises a DC supply and control circuit configured to handle DC supply and control signals communicated between the transceiver chip and the interface, and wherein a frequency of a control channel of the transceiver chip is a near-zero frequency.

4. The system of claim 3, wherein the active antenna module is similar to the transceiver chip except that respective baseband circuitry and up and down conversion mixers of the active antenna module are removed, disabled, or bypassed.

5. The system of claim 1, wherein the active antenna module of the one or more active antenna modules is configured to receive a first modulated MMW signal from the interface for transmission via a plurality of antennas.

6. The system of claim 5, wherein the active antenna module of the one or more active antenna modules is configured to receive a second modulated MMW signal from the plurality of antennas for transmission to the transceiver chip.

7. The system of claim 1, wherein a slave active antenna module of the plurality of slave active antenna modules is similar to the master MMIC except that a respective DC supply and control circuit of the slave active antenna module is optionally disabled.

8. The system of claim 1, wherein the signals further comprise clock signals.

9. A method of providing a millimeter-wave (MMW) transceiver system, the method comprising:
   providing a transceiver chip to generate and to receive and/or transmit signals, the transceiver chip comprising baseband circuitry, up and down conversion mixers, and RF front-end circuitry;
   providing one or more active antenna modules;
   configuring an interface to communicate the signals including modulated MMW signals, a control signal and a DC supply voltage between the transceiver chip and the one or more active antenna modules to avoid local oscillator (LO) generation, wherein the interface is scalable and allows a master millimeter-wave integrated circuit (MMIC) to be used in multiple hierarchical tiled modes; and
   coupling a plurality of slave antenna modules of an active antenna module of the one or more active antenna modules directly parallel to each other, and configuring the MMIC to provide control signals for at least some of the plurality of slave antenna modules.

10. The method of claim 9, wherein configuring the interface comprises configuring an MMW interface including a coaxial cable, a printed circuit board (PCB), or a flexible PCB.

11. The method of claim 9, wherein providing the transceiver chip further comprises providing a DC supply and control circuit to handle DC supply and control signals communicated between the transceiver chip and the interface.

12. The method of claim 9, wherein providing the one or more active antenna modules comprises providing one or more transceiver chips, after removing, disabling, or bypassing respective baseband circuitry and up and down conversion mixers of the one or more transceiver chips.

13. The method of claim 9, wherein a slave antenna module of the plurality of slave antenna modules comprises a master active antenna module from which a respective DC supply and control circuit is optionally disabled.

14. The method of claim 9, further comprising configuring the active antenna module of the one or more active antenna modules to receive a first modulated MMW signal from the interface for transmission via a plurality of antennas.

15. The method of claim 14, further comprising configuring the active antenna module of the one or more active antenna modules to receive a second modulated MMW signal from the plurality of antennas for transmission to the transceiver chip.

16. The method of claim 9, wherein the signals further comprise clock signals.

17. A semiconductor chip comprising:
a plurality of millimeter-wave (MMW) antennas; and
MMW transceiver circuitry comprising:
an active antenna circuit coupled to the plurality of MMW antennas, wherein the active antenna circuit comprises a master millimeter-wave integrated circuit (MMIC) and a plurality of slave antenna modules coupled directly in parallel with each other, and wherein the MMIC is configured to provide control signals for the plurality of slave antenna modules; and
MMW direct conversion mixers coupled to the active antenna circuit via an interface, wherein the interface is configured to communicate modulated MMW signals, a control signal and a DC supply voltage to the active antenna circuit to avoid local oscillator (LO) generation, and wherein the interface is scalable and allows the master MMIC to be used in multiple hierarchical tiled modes.

18. The semiconductor chip of claim 17, further comprising a baseband circuit configured to generate transmit (TX) baseband signals for direct up-conversion and to process receive (RX) baseband signals received from the MMW direct conversion mixers.

19. The semiconductor chip of claim 18, wherein the active antenna circuit comprises a MMW power splitter and combiner, a plurality of phase shifter circuits, a plurality of MMW low-noise amplifiers (LNAs), a plurality of MMW power amplifiers, and a plurality of switch circuits, and wherein the MMW power splitter circuit is configured to split an MMW TX signal received for processing by the active antenna circuit and transmission by the plurality of MMW antennas.

20. The semiconductor chip of claim 19, wherein the MMW direct conversion mixers comprise MMW direct in-phase and quadrature (IQ) up and down conversion mixers, and wherein the TX baseband signals and RX baseband signals comprise IQ signals, and wherein the MMW power splitter circuit is further configured to combine a plurality of MMW RX signals received from the plurality of MMW antennas and processed by the plurality of MMW LNAs and the plurality of phase shifter circuits.

* * * * *